(12) United States Patent
Luning et al.

(10) Patent No.: US 8,030,144 B2
(45) Date of Patent: Oct. 4, 2011

(54) SEMICONDUCTOR DEVICE WITH STRESSED FIN SECTIONS, AND RELATED FABRICATION METHODS

(75) Inventors: Scott Luning, Poughkeepsie, NY (US); Frank Scott Johnson, Wappingers Falls, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 12/576,987

(22) Filed: Oct. 9, 2009

(65) Prior Publication Data

US 2011/0084336 A1    Apr. 14, 2011

(51) Int. Cl.
*H01L 21/00*     (2006.01)
*H01L 21/84*     (2006.01)
*H01L 21/338*    (2006.01)
*H01L 21/336*    (2006.01)
*H01L 21/3205*   (2006.01)

(52) U.S. Cl. ......... 438/157; 438/283; 438/176; 438/587

(58) Field of Classification Search .................. 438/142, 438/157, 283, 176, 587, 595, 303, 184, 182, 438/382, 385, 151, 381, 585, 197, 258
See application file for complete search history.

(56) References Cited

U.S. PATENT DOCUMENTS

2006/0022268 A1* 2/2006 Oh et al. ................. 257/347
2006/0220131 A1* 10/2006 Kinoshita et al. ......... 257/347

* cited by examiner

*Primary Examiner* — Chuong A. Luu
(74) *Attorney, Agent, or Firm* — Ingrassia Fisher & Lorenz, P.C.

(57) ABSTRACT

A method of fabricating a semiconductor device is provided. The method forms a fin arrangement on a semiconductor substrate, the fin arrangement comprising one or more semiconductor fin structures. The method continues by forming a gate arrangement overlying the fin arrangement, where the gate arrangement includes one or more adjacent gate structures. The method proceeds by forming an outer spacer around sidewalls of each gate structure. The fin arrangement is then selectively etched, using the gate structure and the outer spacer(s) as an etch mask, resulting in one or more semiconductor fin sections underlying the gate structure(s). The method continues by forming a stress/strain inducing material adjacent sidewalls of the one or more semiconductor fin sections.

17 Claims, 8 Drawing Sheets ns generally limit the design and fabrication of semiconductor fin arrangements.

SEMICONDUCTOR DEVICE WITH STRESSED FIN SECTIONS, AND RELATED FABRICATION METHODS

TECHNICAL FIELD

Embodiments of the subject matter described herein relate generally to semiconductor devices and related fabrication processes. More particularly, embodiments of the subject matter relate to FinFET devices and related fabrication processes.

BACKGROUND

Transistors, such as metal oxide semiconductor field-effect transistors (MOSFETs), are the core building block of the vast majority of semiconductor devices. Some semiconductor devices, such as high performance processor devices, can include millions of transistors. For such devices, decreasing transistor size, and thus increasing transistor density, has traditionally been a high priority in the semiconductor manufacturing industry.

A FinFET is a type of transistor that can be fabricated using very small scale processes. FIG. 1 is a simplified perspective view of a FinFET 10, which is formed on a semiconductor wafer substrate 12. A FinFET is named for its use of one or more fins 14, which are formed from the semiconductor material of the substrate 12. As shown in FIG. 1, each fin 14 extends between a source region 16 and a drain region 18 of the FinFET 10. The FinFET 10 also includes a gate structure 20 that is formed over and across the fins 14. The surface area of the fins 14 in contact with the gate structure 20 determines the effective channel of the FinFET 10.

BRIEF SUMMARY

A method of fabricating a semiconductor device is provided. The method involves the forming of a fin arrangement on a semiconductor substrate, where the fin arrangement includes one or more semiconductor fin structures. The method continues by forming a gate structure overlying the fin arrangement, forming an outer spacer around sidewalls of the gate structure, and selectively etching the fin arrangement, using the gate structure and the outer spacer as an etch mask. This results in one or more semiconductor fin sections underlying the gate structure. The method then forms a stress/strain inducing material adjacent sidewalls of the one or more semiconductor fin sections.

Also provided is a method of fabricating a semiconductor device on a substrate. This method involves the forming of a semiconductor fin structure overlying a layer of insulating material that resides on the substrate. The method also forms a plurality of adjacent gate structures overlying the fin arrangement, and a respective outer spacer around sidewalls of each gate structure, resulting in a plurality of outer spacers. The method continues by selectively etching the semiconductor fin structure, using the gate structures and the outer spacers as a self-aligning etch mask, resulting in a plurality of discontinuous semiconductor fin sections separated by gaps. Thereafter, the method at least partially fills the gaps with a stress/strain inducing material.

A semiconductor device is also provided. The semiconductor device includes a semiconductor fin structure having an upper surface, a first major sidewall, a second major sidewall opposite the first major sidewall, a first end sidewall, and a second end sidewall opposite the first end sidewall. The semiconductor fin structure overlies a top surface of a layer of insulating material. The semiconductor device also includes a gate structure transversely overlying the semiconductor fin structure and coupled to the upper surface, the first major sidewall, and the second major sidewall of the semiconductor fin structure. Moreover, regions of stress/strain inducing material overlie the top surface of the layer of insulating material, and the regions are in contact with the first end sidewall and the second end sidewall of the semiconductor fin structure.

This summary is provided to introduce a selection of concepts in a simplified form that are further described below in the detailed description. This summary is not intended to identify key features or essential features of the claimed subject matter, nor is it intended to be used as an aid in determining the scope of the claimed subject matter.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

Figure 1:
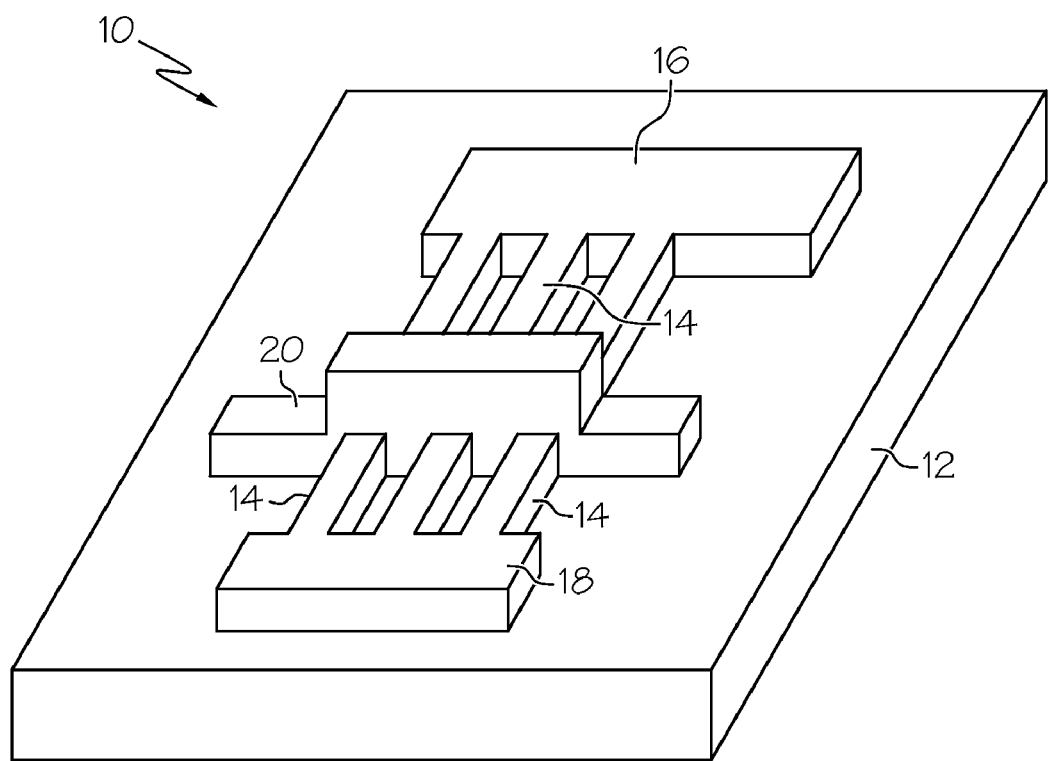
FIG. 1 is a simplified perspective view of a conventional FinFET having a plurality of fins.

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

Techniques and technologies described herein may be utilized to fabricate MOS transistor devices, including NMOS transistor devices, PMOS transistor devices, and CMOS transistor devices. Although the term "MOS device" properly refers to a device having a metal gate electrode and an oxide gate insulator, that term will be used throughout to refer to any semiconductor device that includes a conductive gate electrode (whether metal or other conductive material) that is positioned over a gate insulator (whether oxide or other insulator) which, in turn, is positioned over a semiconductor substrate. Various steps in the manufacture of MOS components and FinFETs are well known and so, in the interest of brevity, many conventional steps will only be mentioned briefly herein or will be omitted entirely without providing the well known process details.

Gate straining and/or channel straining techniques are often utilized during the fabrication of planar semiconductor transistor devices to enhance the mobility of carriers (holes or electrons) in the channel region. Such straining techniques can be difficult to implement with FinFETs for various reasons. For example, while deposited strained layers (such as compressive or tensile nitride) are often used with planar devices, the three-dimensional topography of FinFET devices makes it difficult to effectively and precisely pattern strained layers. Moreover, the materials used to create Fin- FET devices can introduce issues related to selective etching of strained layers. Furthermore, strained over-layering in FinFET devices is less effective (relative to strained over-layering in planar devices) because the channel of a FinFET is primarily defined on the sidewalls of the fin or fins. Thus, surface strain layers have less effect on a FinFET channel.

Planar transistor devices often use confined source/drain recesses that are filled with stress/strain inducing material, such as an epitaxially grown semiconductor material. Conventional FinFET designs, however, do not employ well-confined source/drain regions or recesses. Consequently, even if an epitaxial stress/strain inducing material is grown near the source/drain regions of a conventional FinFET, the resulting increase in mobility will be much less than that achieved in a planar device having well-confined source/drain regions formed from stress/strain inducing material.

Some planar transistor devices employ a stress memorization technique (SMT) that introduces stress by amorphizing and annealing the source/drain regions surrounding the channel. SMT effectively damages and "converts" the source/drain regions into stress/strain inducing regions. Unfortunately, SMT cannot be leveraged in conventional FinFET devices because such devices do not have embedded source/drain regions and, therefore, there are no regions available to amorphize and anneal. Consequently, most traditional straining approaches that might be suitable for planar transistor devices cannot be effectively implemented with FinFET devices, or such conventional straining approaches do not provide substantial mobility benefits in FinFET devices.

Scaling of FinFET devices can also introduce some issues that make it difficult to effectively add stress to the source/drain regions. In this regard, as gate pitch scales down, the addition of stress to the channel (to enhance mobility) becomes more difficult due to the reduction of available space between adjacent gate structures. This is caused by the lack of dielectric scaling, which results in the gate structure itself occupying a larger portion of the pitch. This hinders scaling in two ways: (1) it reduces the room for depositing stress material over the source/drain; and (2) it increases the channel length that must be strained in order to achieve the mobility enhancement. Moreover, junctions in a FinFET become more difficult to scale. Since the junctions do not completely scale, the source/drain spacer must be under-scaled in order to prevent the source/drain junction from overlapping the channel and introducing severe short channel effects.

In a typical FinFET, a significant portion of the space between adjacent channels is occupied by the original semiconductor fin material. The devices and fabrication processes described here take advantage of this characteristic in a manner that makes it possible to achieve beneficial channel stress in a FinFET structure. The techniques and processes described below use the available space and volume between adjacent gate structures for stress/strain material. In certain embodiments, some of the unstrained fin material is removed prior to selectively growing a self-aligned, strained, and in-situ doped source/drain material for the FinFET. More specifically, the fin material is etched away (spacers and a gate hard mask prevent the etch from effecting the channel portion of the fin), and, thereafter, an appropriate stress/strain inducing material is selectively grown for use as the source/drain region. Selective epitaxial material can be grown in a manner that merges the otherwise separate source/drain fins. In practice, the relatively large volume of stress/strain inducing material allows more force to be imparted to the channel region, thus further increasing mobility (relative to conventional approaches). A blocking layer can be patterned as needed so that compressive and tensile material can be grown for PFET and NFET devices as appropriate for improved mobility.

Figure 2:
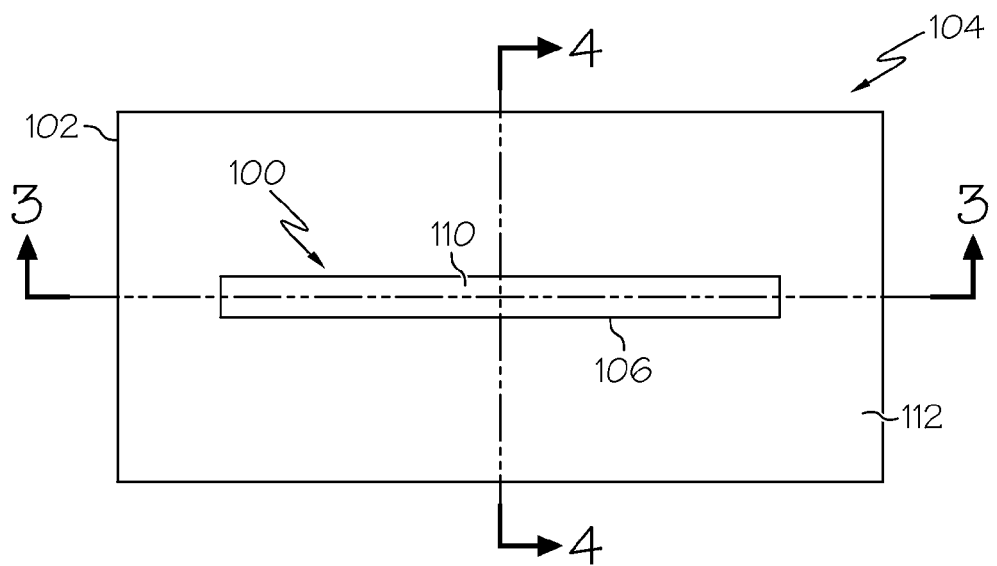
FIGS. 2-18 are cross-sectional and top views that illustrate a semiconductor device structure and an exemplary process for fabricating it.
Figure 3:
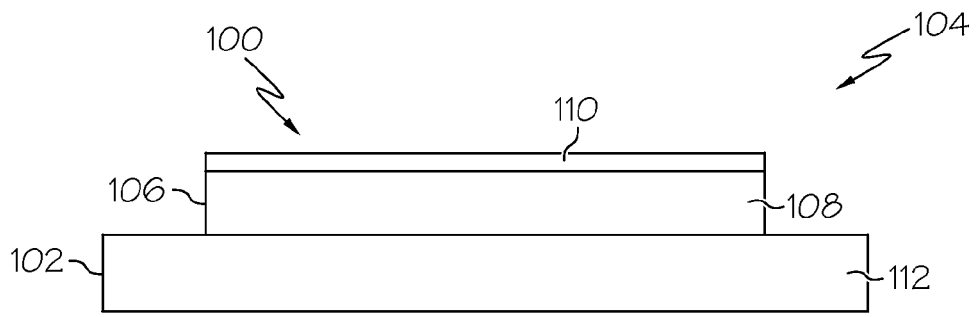
Figure 4:
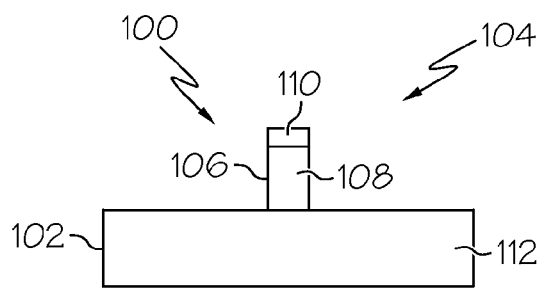

FIGS. 2-18 illustrate an exemplary process for fabricating a semiconductor device in accordance with exemplary embodiments. This example refers to the fabrication of a FinFET structure, which may include any number of FinFET transistor devices. Referring to FIGS. 2-4, the illustrated fabrication process begins by forming a fin arrangement 100 on a semiconductor substrate 102. FIG. 2 represents a top view of the resulting device structure 104 after the fin arrangement 100 has been formed, FIG. 3 is a cross-sectional view of the device structure 104 as viewed from line 3-3 (in FIG. 2), and FIG. 4 is a cross-sectional view of the device structure 104 as viewed from line 4-4 (in FIG. 2).

For simplicity and ease of description, the illustrated embodiment of the fin arrangement 100 includes only one fin structure 106. In practice, however, the fin arrangement 100 could instead include a plurality of semiconductor fin structures. Each fin structure 106 includes a fin 108 formed from a semiconductor material. For the illustrated embodiment, the fin structure 106 also includes a dielectric cap 110 overlying the fin 108. The semiconductor fin material is preferably a silicon material, wherein the term "silicon material" is used herein to encompass the relatively pure silicon materials typically used in the semiconductor industry as well as silicon admixed with other elements such as germanium, carbon, and the like. Alternatively, the semiconductor fin material can be germanium, gallium arsenide, or the like. In an exemplary embodiment, the thickness of the semiconductor fin material is about 65 nanometers, however, in practical embodiments, the thickness of the semiconductor fin material may range from about 40 nanometers to about 200 nanometers.

In an exemplary embodiment, the semiconductor fin structure 106 is formed overlying an appropriate layer of insulating material 112 that resides on the substrate 102. In this regard, the substrate 102 may be a silicon-on-insulator (SOI) substrate having a support layer (not shown), the layer of insulating material 112 on the support layer, and the semiconductor fin material on the layer of insulating material 112. The layer of insulating material 112 is preferably realized as an oxide layer formed in a subsurface region of the semiconductor substrate, also known as a buried oxide (BOX) layer. In an exemplary embodiment, the thickness of the layer of insulating material 112 is about 300 nanometers, however, in practical embodiments, the thickness of the layer of insulating material 112 may range from about 50 nanometers to about 1000 nanometers.

The fin arrangement 100 can be created using any number of known process steps and techniques. In one typical process, the fin arrangement 100 is fabricated by creating an appropriate mandrel, forming spacers around the mandrel, removing the mandrel while leaving the spacers in place, and then etching the semiconductor material using the spacers as a hard mask to define the fins. In accordance with certain embodiments, the spacer material remains on the semiconductor fin material. In this regard, the dielectric cap 110 depicted in FIGS. 2-4 represents the remaining spacer material for this particular embodiment. In some embodiments, however, the dielectric cap 110 can be removed from the fin structure 106 before forming the gate structure.

Figure 5:
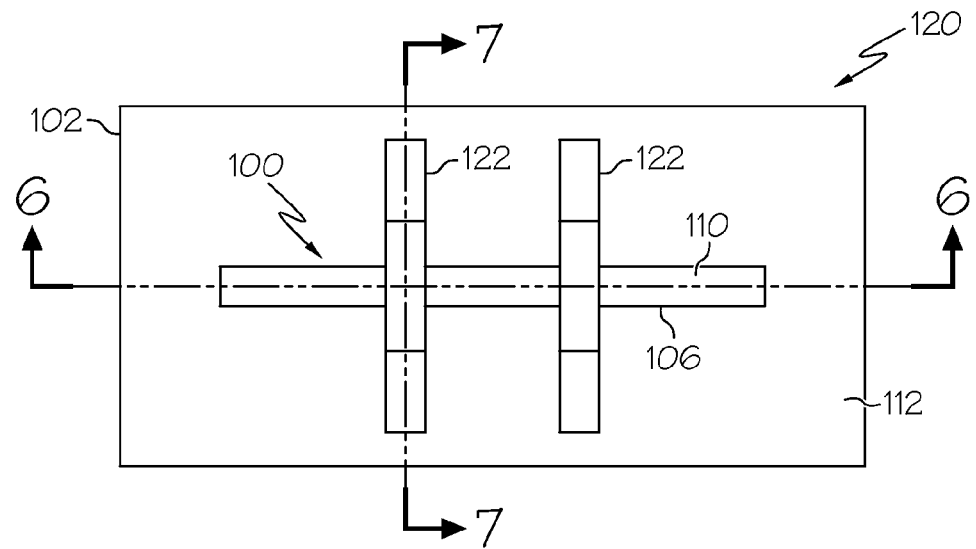
Figure 6:
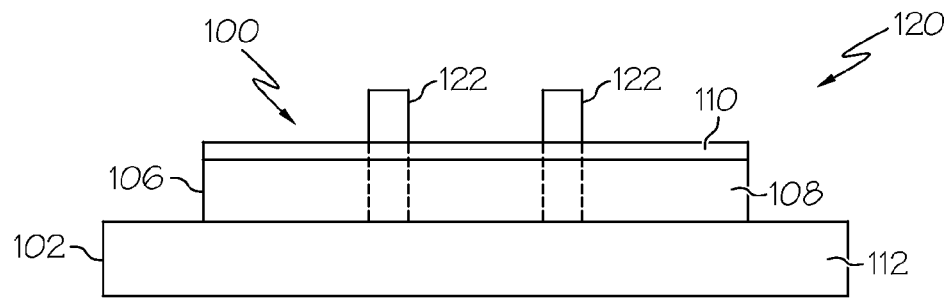
Figure 7:
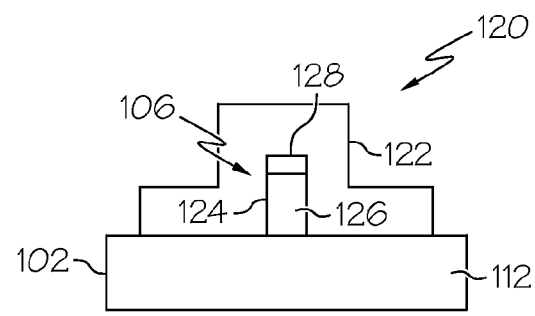

Referring to FIGS. 5-7, the illustrated embodiment of the fabrication process continues by forming a plurality of suitably configured gate structures overlying the fin arrangement 100. For this example, a transistor is formed anywhere a gate intersects a fin. Thus, the illustrated embodiment might represent two transistors in series. The two transistors could share a drain and have separate sources, or they could share a source and have separate drains. Alternatively, the two transistors could be wired to share both sources and drains. That said, at least one source/drain region is shared, in the center between the two gate structures.

FIG. 5 is a top view of the resulting device structure 120 after the gate structures 122 have been formed, FIG. 6 is a cross-sectional view of the device structure 120 as viewed from line 6-6 (in FIG. 5), and FIG. 7 is a cross-sectional view of the device structure 120 as viewed from line 7-7 (in FIG. 5). For simplicity and ease of description, the illustrated embodiment of the device structure 120 includes two adjacent gate structures 122 that are spaced apart by a defined gate pitch. In practice, however, the device structure 120 could instead include only one gate structure (e.g., for a single transistor) or more than two gate structures (e.g., for a plurality of transistors), as appropriate for the particular embodiment. The adjacent gate structures 122 can be utilized to create a semiconductor device structure that includes adjacent transistors that share source/drain regions. In this regard, the area between two adjacent gate structures 122 could be used as a common source region or as a common drain region for two transistor devices.

Each gate structure 122 can be realized as a composite structure or stack that is formed from a plurality of different layers and materials. In this regard, the gate structures 122 can be formed by conformally depositing layers of material, using photolithographic techniques to pattern the deposited layers of material, and selectively etching the patterned layers to form the desired size and shape for the gate structures 122. For example, a relatively thin layer of dielectric material (commonly referred to as the gate insulator) can be initially deposited using, for example, a sputtering or chemical vapor deposition (CVD) technique. Alternatively, this gate insulator layer could be formed by growing a dielectric material, such as silicon dioxide, on exposed silicon surfaces. In certain embodiments, a gate electrode material, such as a polycrystalline silicon material or a metal material (e.g., titanium nitride, tantalum nitride, tungsten nitride, or another metal nitride) is formed overlying the gate insulator layer. This gate electrode material could be deposited to a height that exceeds the top of the fin structure 106 and then polished back as needed. In particular embodiments, another insulating material is then formed overlying the gate electrode material. This insulating material (such as silicon nitride) can be deposited using, for example, a sputtering or CVD technique. This insulating material can then be patterned as desired for use as a hard mask for etching of the gate structures 122. It should be appreciated that the particular composition of the gate structures 122 and the manner in which they are formed may vary from one embodiment to another, and that the brief description of the gate stack formation is not intended to be limiting or restrictive of the recited subject matter. For example, if simple deposition and patterning steps are used, then the gate structures 122 will appear as shown in FIG. 7. If, however, planarization steps are used, then the gate structures 122 would have a planar upper surface, independent of the presence of the fin arrangement 100.

Referring to FIG. 7, the gate structures 122 are formed such that each one transversely overlies the semiconductor fin structure 106. As depicted in FIG. 7, each gate structure 122 is coupled to (and is in contact with) both major sidewalls 124/126 and the upper surface 128 of the fin structure 106. Moreover, portions of each gate structure 122 are coupled to (and are in contact with) the layer of insulating material 112. Thus, each gate structure 122 begins and ends on the layer of insulating material 112, while crossing over the fin structure 106.

Figure 8:
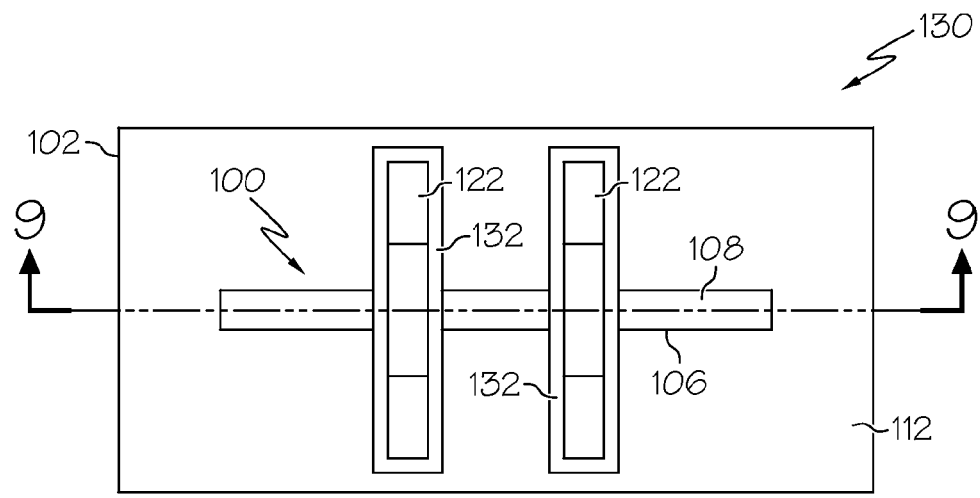
Figure 9:
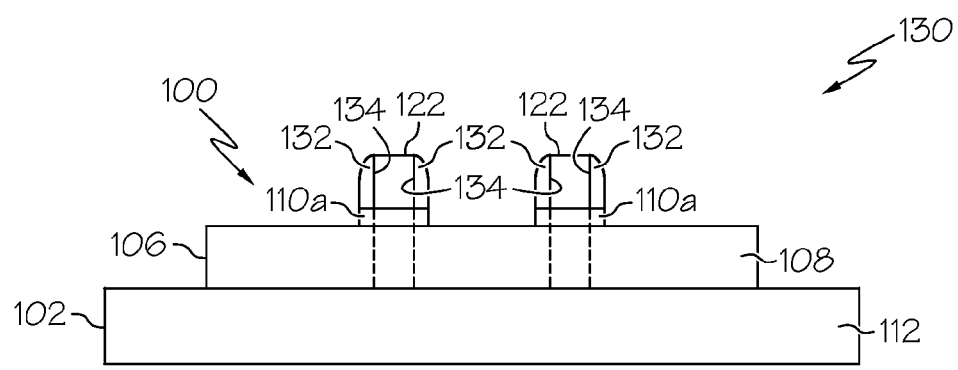

Referring now to FIGS. 8 and 9, the illustrated embodiment of the fabrication process continues by forming inner spacers around the gate structures 122. FIG. 8 is a top view of the resulting device structure 130 after the inner spacers 132 have been formed, and FIG. 9 is a cross-sectional view of the device structure 130 as viewed from line 9-9 (in FIG. 8). As shown in FIG. 9, each inner spacer 132 is formed adjacent the sidewalls 134 of the respective gate structure 122. The inner spacers 132 are formed from an appropriate material that is resistant to subsequent selective etch step(s), for example, a silicon nitride or a silicon oxide material. In an exemplary embodiment, the inner spacers 132 are formed by conformally depositing a layer of the spacer material overlying the device structure 120 that is depicted in FIGS. 5-7. In certain embodiments, the spacer material is a silicon nitride that is deposited by rapid thermal chemical vapor deposition (RTCVD) to a thickness of about 100 nanometers. After depositing the spacer material, the inner spacers 132 can be formed by anisotropically etching the spacer material using, for example, a plasma-based reactive ion etching (RIE) technique with commonly known etchant chemistries.

For the illustrated embodiment, etching of the spacer material also results in removal of some of the dielectric cap 110 (see FIG. 6) from the semiconductor fin material. The remainder of the dielectric material forms sections of the dielectric cap 110*a* underlying the gate structures 122; these sections of the dielectric cap 110*a* may be considered to be self-aligned with the corresponding inner spacers 132, as generally depicted in FIG. 9. In certain embodiments, the material that forms the dielectric cap 110 is completely removed from the upper surface of the fin 108 (except for the portion of the material that is protected by the gate structures 122 and the inner spacers 132). Alternatively, some of the material that forms the dielectric cap 110 could remain on the exposed upper surface of the fin 108.

Figure 10:
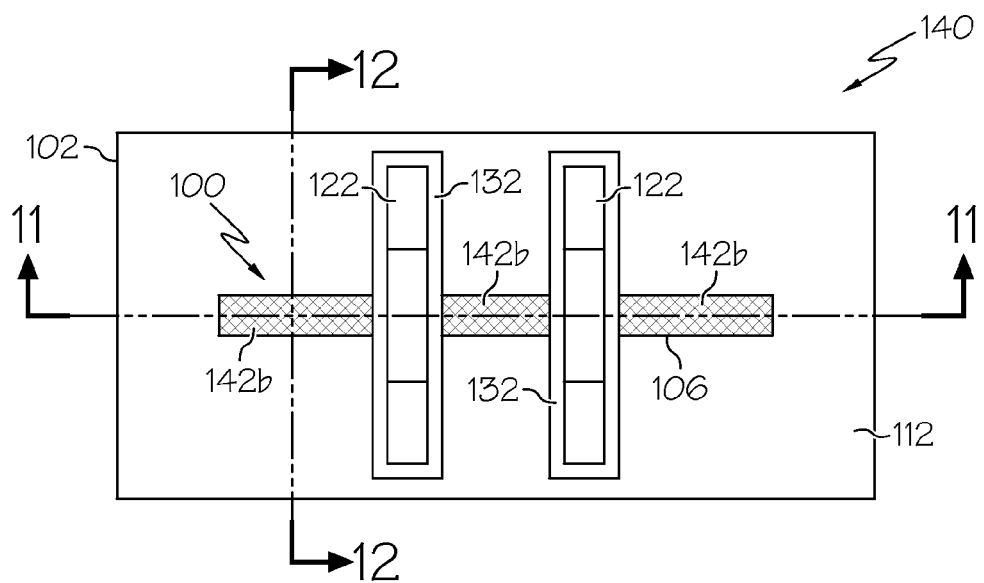
Figure 11:
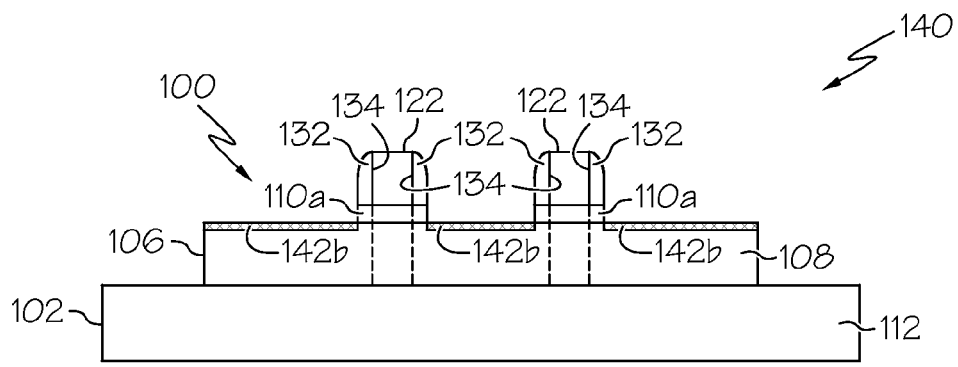
Figure 12:
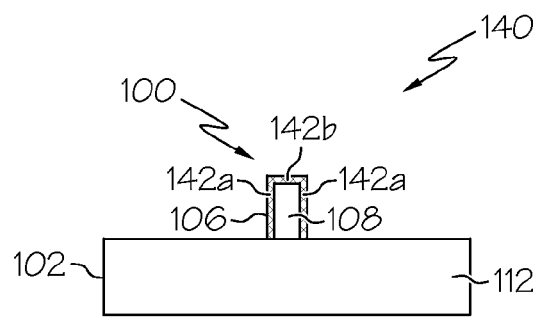

Referring to FIGS. 10-12, the illustrated embodiment of the fabrication process continues by creating extension implants in the semiconductor fin material. FIG. 10 is a top view of the resulting device structure 140 after the extension implants 142 have been created, FIG. 11 is a cross-sectional view of the device structure 140 as viewed from line 11-11 (in FIG. 10), and FIG. 12 is a cross-sectional view of the device structure 140 as viewed from line 12-12 (in FIG. 10). Notably, the cross-section of the fin structure 106 will be as shown in FIG. 12 along its longitudinal axis (except for those sections that reside under the gate structures 122 and corresponding inner spacers 132). Moreover, although FIG. 11 depicts the extension implants 142 being self-aligned with the inner spacers 132, they may actually extend somewhat further toward the channel region that is defined under the inner spacers 132 and the gate structures 122.

The extension implants 142 are formed by implanting ions of an appropriate conductivity-determining impurity species into the exposed areas of the semiconductor fin material, using the gate structures 122 and the inner spacers 132 as an ion implantation mask. In the context of a FinFET device, the extension implants 142 serve as source/drain extension implants. The ion implantation may be achieved using orthogonal ion bombardment and/or tilted ion bombardment in one or more directions, as desired. Moreover, the particular impurity species, implantation energy, and other parameters can be chosen and controlled in a known manner to achieve the desired profile and characteristics for the extension implants 142. It should be appreciated that sidewall extension implants 142a will be formed in exposed sidewall regions of the fin 108, including the two major sidewall surfaces. In addition, upper extension implants 142b will be formed in exposed upper regions of the fin 108. These characteristics are depicted in FIG. 12; the extension implant 142 is formed on both vertical sidewalls of the fin 108, and on the upper surface of the fin 108. As mentioned previously, some of the material used for the dielectric cap 110 could remain on the exposed upper surface of the fin 108. If so, then the extension implants 142 might only be formed on the major sidewalls of the fin 108, or the profile of the extension implants 142 on the upper surface of the fin 108 may be shallower than the profile of the extension implants 142 on the major sidewalls of the fin 108. In practice, such variation in the extension implants 142 is tolerable because the major sidewall surfaces of the fin 108 play a primary role in FinFET operation, relative to the upper surface of the fin 108.

It should be appreciated that the extension implants 142 need not be created at this particular time in the overall process. Although extension implants are usually implemented, they are not always used. If they are used, then they could instead be formed after the formation of the outer source/drain spacers (discussed in the following paragraphs with reference to FIGS. 13 and 14). In this regard, the fin material could be implanted and annealed after formation of the outer source/drain spacers, and prior to the fin etch (discussed below with reference to FIGS. 15 and 16).

Figure 13:
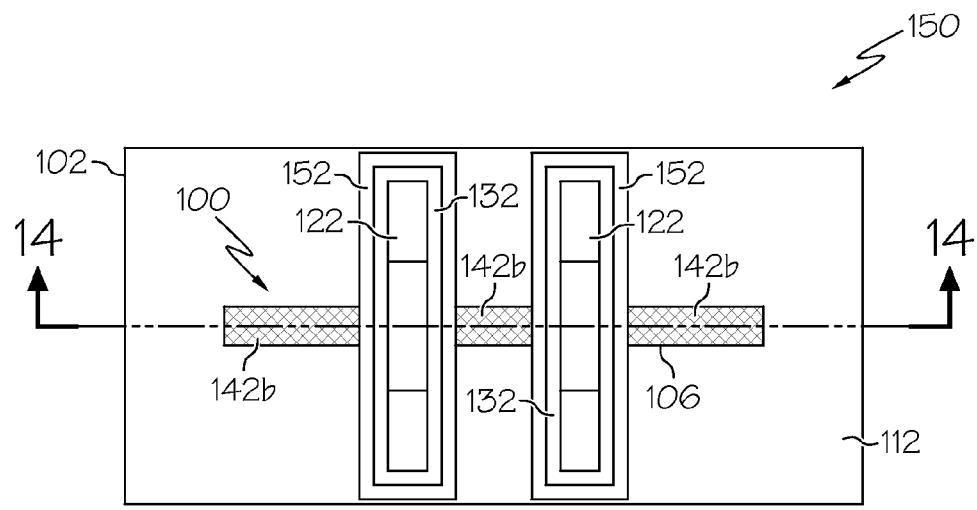
Figure 14:
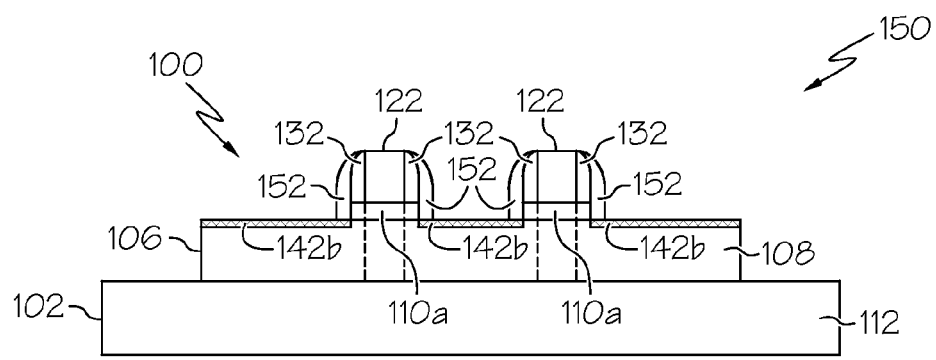

Referring now to FIGS. 13 and 14, the illustrated embodiment of the fabrication process continues by forming outer spacers around the sidewalls of the gate structures 122. FIG. 13 is a top view of the resulting device structure 150 after the outer spacers 152 have been formed, and FIG. 14 is a cross-sectional view of the device structure 150 as viewed from line 14-14 (in FIG. 13). For this particular embodiment, each outer spacer 152 is formed such that it is adjacent to a corresponding one of the inner spacers 132. In other words, each outer spacer 152 is formed around one of the inner spacers 132. The outer spacers 152 are formed from an appropriate material that is resistant to subsequent selective etch step(s), for example, a silicon nitride or a silicon oxide material. In certain embodiments, the material used for the outer spacers 152 is the same as the material used for the inner spacers 132. In an exemplary embodiment, the outer spacers 152 are formed by conformally depositing a layer of the spacer material overlying the device structure 140 that is depicted in FIGS. 10-12. In certain embodiments, the spacer material is a silicon nitride that is deposited by rapid thermal chemical vapor deposition (RTCVD) to a thickness of about 100 nanometers. After depositing the spacer material, the outer spacers 152 can be formed by anisotropically etching the spacer material using, for example, a plasma-based reactive ion etching (RIE) technique with commonly known etchant chemistries.

As shown in FIG. 14, each outer spacer 152 is formed adjacent to an inner spacer 132 and adjacent to the sidewalls of a respective section of the dielectric cap 110a. Moreover, each outer spacer 152 overlies portions of the extension implants 142. In this example, the base of each outer spacer 152 extends to the fin 108 such that the outer spacer 152 covers the ends of two extension implants 142 (see FIG. 14). The outer spacers 152 are sized and scaled such that a sufficient gap or space remains between adjacent outer spacers 152. Thus, an appropriate amount of the semiconductor fin material remains exposed between adjacent outer spacers 152. In practice, the distance between two adjacent outer spacers 152 should be at least as wide as the patterned gate length in order to contain enough stressor material to sufficiently impact the channel mobility.

Figure 15:
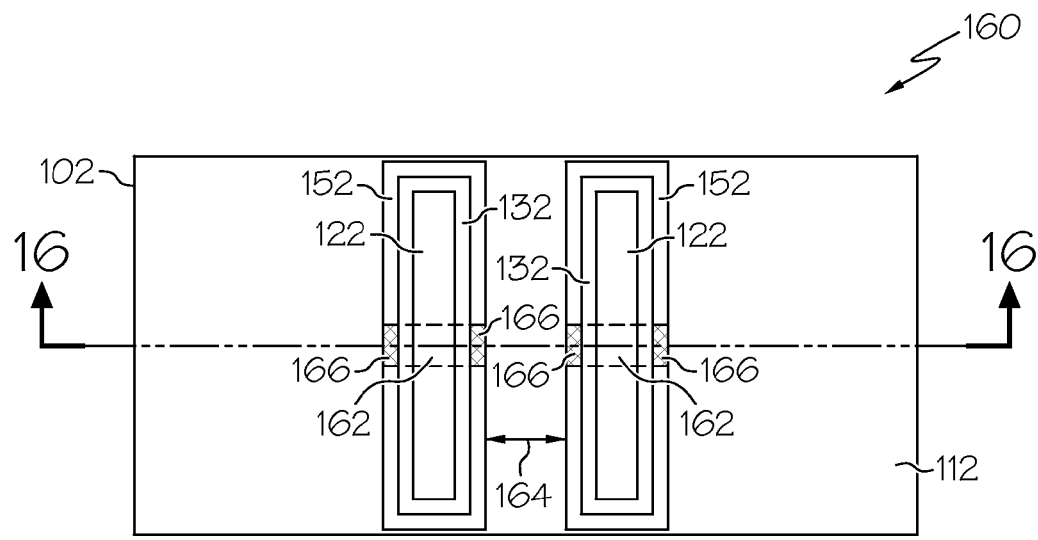
Figure 16:
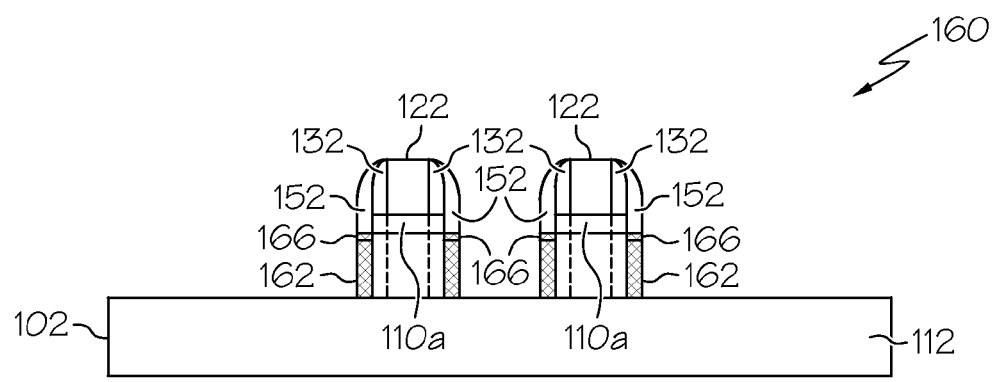

Referring now to FIGS. 15 and 16, the illustrated embodiment of the fabrication process continues by selectively etching the fin arrangement 100 to form semiconductor fin sections underlying the gate structures 122. FIG. 15 is a top view of the resulting device structure 160 after the fin sections 162 have been formed, and FIG. 16 is a cross-sectional view of the device structure 160 as viewed from line 16-16 (in FIG. 15).

In the illustrated embodiment, the fin structure 106 (see FIG. 14) is selectively etched using the gate structures 122, the inner spacers 132, and the outer spacers 152 as a self-aligning etch mask. The semiconductor fin material is selectively and anisotropically etched using appropriate etching techniques and/or chemistries that are selective to the particular semiconductor fin material. For example, the fin structure 106 could be etched using RIE, sigma, chemical, and/or other techniques as desired. The anisotropic nature of this etching step creates the fin sections 162 underlying and substantially self-aligned with the outer spacers 152, as depicted in FIG. 16. In particular embodiments, the exposed semiconductor fin material is completely removed from the layer of insulating material. Such complete removal results in the plurality of discontinuous semiconductor fin sections 162, as depicted in FIG. 15 and FIG. 16. The fin sections 162 will be separated by gaps, such as the gap 164 shown in FIG. 15.

As a result of etching the semiconductor fin material, unprotected portions of the extension implants 142 will be removed. However, corresponding protected sections of the extension implants 166 will remain in the fin sections 162. For the illustrated example, these sections of the extension implants 166 represent the sections that reside under the outer spacers 152.

Figure 17:
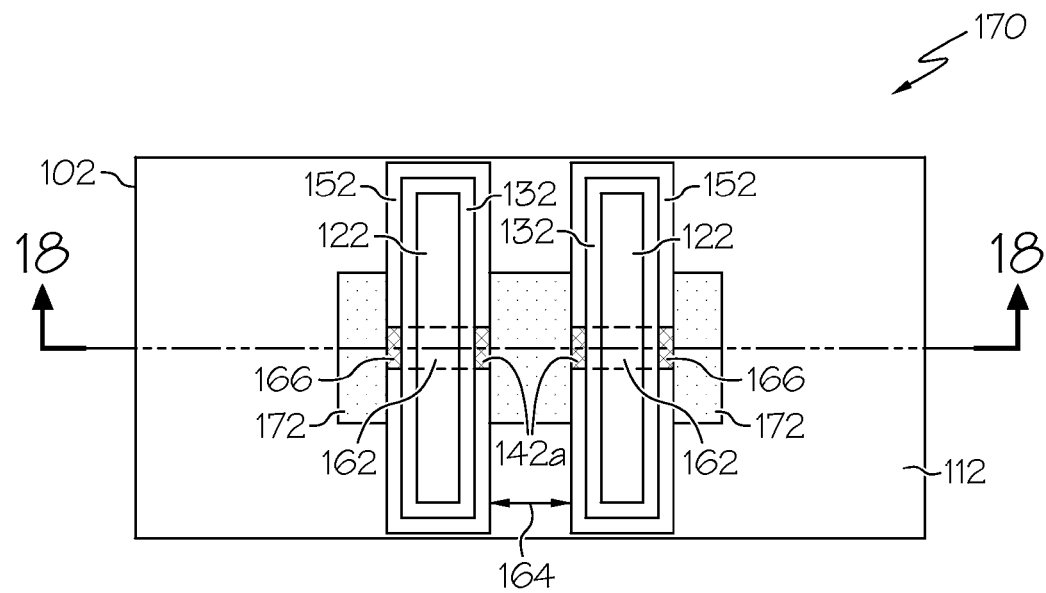
Figure 18:
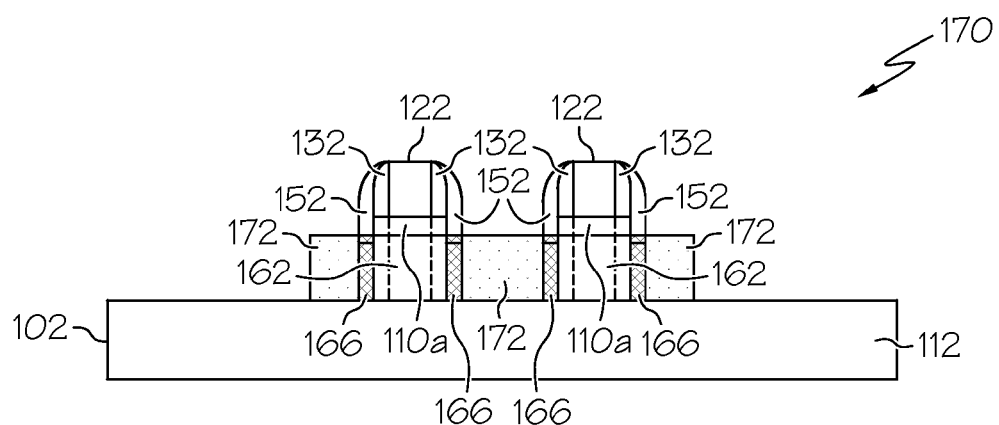

Referring now to FIGS. 17 and 18, the illustrated embodiment of the fabrication process continues by at least partially filling the gaps 164 with an appropriate stress/strain inducing material. FIG. 17 is a top view of the resulting device structure 170 after the stress/strain inducing material 172 has been formed, and FIG. 18 is a cross-sectional view of the device structure 170 as viewed from line 18-18 (in FIG. 17). In practice, the stress/strain inducing material 172 is formed such that it is adjacent to sidewalls of the semiconductor fin sections 162. Referring to FIG. 17, it may be desirable to create "dummy" structures (not shown) to the left and right of the illustrated gate structures 122 so that the stress/strain inducing material 172 can be symmetrically formed and constrained between two adjacent structures.

In certain embodiments, the stress/strain inducing material 172 is realized using an epitaxial semiconductor material, although non-epitaxial materials could also be utilized. Furthermore, the stress/strain inducing material 172 could be an in-situ doped material such that a desired doping profile or concentration is realized for the corresponding regions. This approach is desirable so that the source/drain regions formed from the stress/strain inducing material 172 need not be subsequently doped using an additional ion implantation step.

For this particular example, epitaxial semiconductor material is selectively grown adjacent the sidewalls of the semiconductor fin sections 162 such that the grown material electrically couples adjacent fin sections 162 together. Coupling of adjacent fin sections 162 in this manner results in the formation of a common source/drain region for two adjacent transistor device structures. In accordance with one embodiment, the stress/strain inducing regions are formed by epitaxially growing an appropriate semiconductor material on exposed surfaces of the fin sections 162, wherein the inner spacers 132, the outer spacers 152, and the exposed portion of the gate structures 122 serve as an epitaxial mask that prevents any epitaxial growth on the underlying and protected surfaces of the semiconductor fin sections 162. Preferably, the epitaxial material is grown such that it fills the gaps 164 (in the direction orthogonal to the gate structures 122) between adjacent fin sections 162. Moreover, the epitaxial material should be grown to an appropriate height, e.g., at least as high as the fin sections 162 (as depicted in FIG. 18). In general, a larger volume of stress/strain inducing material 172 will result in larger forces imparted to the channel, with a corresponding increase in carrier mobility.

In certain embodiments where the semiconductor fin material is silicon, the stress/strain inducing material 172 could be a material (such as epitaxial silicon germanium) having a larger lattice constant than the semiconductor fin material, and which applies a compressive longitudinal stress to the channel. Alternatively, the stress/strain inducing material 172 could be a material (such as epitaxial silicon carbon) having a smaller lattice constant than the semiconductor fin material, and which applies a tensile longitudinal stress to the channel. Other suitable materials that could be used for the stress/strain inducing material include, without limitation: compressive polycrystalline silicon germanium; tensile polycrystalline silicon carbon; a gallium arsenide material; an aluminum gallium arsenide material; or the like. The specific type of stress/strain inducing material 172 is selected to impart the appropriate stress to increase carrier mobility in the channel, as will be appreciated in the art. Consequently, the particular type of stress/strain inducing material 172 will depend on whether the semiconductor device will be a p-type FinFET or an n-type FinFET. Moreover, whether a compressive or tensile stress/strain inducing material 172 is used will be influenced by the direction of current flow relative to the channel and the orientation of the forces imparted by the stress/strain inducing material. For example, for a PFET device, it is desirable to impart compressive stress to the channel in the direction of current flow, and for an NFET device, it is desirable to impart tensile stress to the channel in the direction of current flow. Due to the three-dimensional topography of the gate structures 122, however, the stress/strain inducing material could also impart stress in a direction perpendicular to current flow and/or in a direction transverse to current flow. Which stress component will have the most impact on carrier mobility and, therefore, whether compressive or tensile stress/strain inducing material 172 is used, could vary from one embodiment to another.

After forming the regions of stress/strain inducing material 172, the fabrication of at least one transistor device or FinFET can be completed using any number of known process steps, modules, and techniques. For instance, the manufacturing process may form electrical contacts, additional dielectric layers, conductive plugs, and other common features. These additional steps are well known and, therefore, will not be described here. For the illustrated embodiment, the resulting transistor device(s) will include at least the gate structures 122, the semiconductor fin sections 162, and the stress/strain inducing material 172.

In this example, the resulting semiconductor device will include at least two fin sections 162 and at least two corresponding sections of the dielectric cap 110*a* created from a common semiconductor fin structure 106 (in practice, any number of transistor devices with shared source/drain regions can be formed on the semiconductor device). As described previously with reference to FIG. 7, the fin structure 106 has an upper surface 128, a first major sidewall 124, and a second major sidewall 126 that is opposite the first major sidewall 124. After the fin structure 106 is selectively etched, each remaining section has a first end sidewall and a second end sidewall that is opposite the first end sidewall. In this regard, the end sidewalls correspond to the junctions between the stress/strain inducing material 172 and the sections of the extension implants 166 (see FIG. 18). For this particular embodiment, the end sidewalls are self-aligned with the outer spacers 152. The fin structure 106 and the resulting etched segments thereof overlie the top surface of the layer of insulating material 112, as shown in FIG. 18.

After fabrication of the semiconductor device, each gate structure 122 transversely overlies a respective segment of the fin structure 106. Moreover, each gate structure 122 will be coupled to the upper surface 128, the first major sidewall 124, and the second major sidewall 126 of its respective segment of the fin structure 106 (see FIG. 7). The regions of stress/strain inducing material 172 are overlying the top surface of the layer of insulating material 112, and the stress/strain inducing material 172 will be in contact with the end sidewalls of the segments of the fin structure 106 (see FIG. 18). The regions of stress/strain inducing material 172 reside between adjacent segments of the fin structure 106 such that they impart compressive or tensile forces (depending upon the particular type of material used) on the segments of the fin structure 106. The compressive/tensile forces in turn increase carrier mobility in the channel region of the device.

FIGS. 2-18 and the related description can apply to an n-type FinFET device or a p-type FinFET device. In many applications, however, both n-type and p-type FinFET devices are fabricated on a common wafer or substrate. For such applications (commonly referred to as CMOS applications), additional process steps can be performed as needed to properly form both types of transistor devices. For example, when performing ion implantation to create the extension implants 142 for n-type devices, the p-type devices can be protected using a suitably patterned mask (and vice versa). As another example, when forming the outer spacers for n-type devices (see FIG. 14), the deposited spacer material overlying the p-type devices can be protected using a suitably patterned mask to selectively block the formation of the stress/strain material. Thereafter, the stress/strain inducing material for the p-type devices can be formed in a manner similar to that described above.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A method of fabricating a semiconductor device, the method comprising:
    forming a fin arrangement on a semiconductor substrate, the fin arrangement comprising one or more semiconductor fin structures;
    forming a plurality of gate structure overlying the fin arrangement;
    forming outer spacers around sidewalls of the plurality of gate structures;

selectively etching the fin arrangement, using the plurality of gate structures and the outer spacers as an etch mask, resulting in a plurality of discontinuous semiconductor fin sections separated by gaps and underlying the plurality of gate structures; and forming a stress/strain inducing material adjacent sidewalls of the plurality of discontinuous semiconductor fin sections to at least partially fill the gaps with the stress/strain inducing material.

2. The method of claim 1, wherein forming the stress/strain inducing material comprises epitaxially growing a semiconductor material adjacent the sidewalls of the plurality of discontinuous semiconductor fin sections.

3. The method of claim 2, wherein epitaxially growing the semiconductor material comprises epitaxially growing an in-situ doped semiconductor material adjacent the sidewalls of the plurality of discontinuous semiconductor fin sections.

4. The method of claim 1, wherein forming the stress/strain inducing material comprises epitaxially growing silicon germanium adjacent the sidewalls of the plurality of discontinuous semiconductor fin sections.

5. The method of claim 1, wherein forming the stress/strain inducing material comprises epitaxially growing silicon carbon adjacent the sidewalls of the plurality of discontinuous semiconductor fin sections.

6. The method of claim 1, wherein each of the plurality of discontinuous semiconductor fin structures comprises a fin formed from a semiconductor fin material and a dielectric cap overlying the fin, and wherein the method further comprises:

prior to forming the outer spacers, forming inner spacers adjacent the sidewalls of the plurality of gate structures; and prior to forming the outer spacers, implanting ions of an impurity species into exposed areas of the semiconductor fin material, using the plurality of gate structures and the inner spacers as an ion implantation mask, resulting in extension implants for the semiconductor device.

7. The method of claim 6, further comprising removing at least a portion of each dielectric cap from its respective fin, prior to implanting the ions.

8. The method of claim 6, wherein:

forming the outer spacers comprises forming the outer spacers adjacent the inner spacers; and each outer spacer overlies portions of the extension implants.

9. The method of claim 1, further comprising creating at least one transistor device that comprises the plurality of gate structures and the plurality of discontinuous semiconductor fin sections.

10. A method of fabricating a semiconductor device structure on a substrate, the method comprising:

forming a semiconductor fin structure overlying a layer of insulating material that resides on the substrate;

forming a plurality of adjacent gate structures overlying the semiconductor fin structure;

forming a respective outer spacer around sidewalls of each gate structure, resulting in a plurality of outer spacers;

selectively etching the semiconductor fin structure, using the gate structures and the outer spacers as a self-aligning etch mask, resulting in a plurality of discontinuous semiconductor fin sections separated by gaps; and thereafter, at least partially filling the gaps with a stress/strain inducing material.

11. The method of claim 10, wherein at least partially filling the gaps comprises selectively and epitaxially growing a stress/strain inducing semiconductor material adjacent sidewalls of the semiconductor fin sections.

12. The method of claim 11, wherein the semiconductor fin structure comprises a fin formed from a semiconductor fin material and a dielectric cap overlying the fin, and wherein the method further comprises:

prior to forming the outer spacers, forming a respective inner spacer adjacent the sidewalls of each gate structure, resulting in a plurality of inner spacers; and prior to forming the outer spacers, creating extension implants by implanting ions of an impurity species into exposed areas of the semiconductor fin material, using the gate structures and the inner spacers as an ion implantation mask.

13. The method of claim 12, further comprising removing portions of the dielectric cap from the semiconductor fin material, prior to creating the extension implants.

14. The method of claim 12, wherein:

forming the outer spacers comprises forming the outer spacers adjacent the inner spacers; and the outer spacers are formed overlying portions of the extension implants.

15. The method of claim 12, wherein creating the extension implants creates an upper extension implant in an exposed upper region of the semiconductor fin material.

16. The method of claim 12, wherein creating the extension implants creates a sidewall extension implant in an exposed sidewall region of the semiconductor fin material.

17. The method of claim 10, further comprising creating a plurality of transistor devices, each comprising one of the adjacent gate structures and one of the discontinuous semiconductor fin sections.

* * * * *